United States Patent [19]
Dent

[11] Patent Number: 5,629,655
[45] Date of Patent: May 13, 1997

[54] INTEGRATED DISTRIBUTED RC LOW-PASS FILTERS

[75] Inventor: Paul W. Dent, Stehag, Sweden

[73] Assignee: Ericsson Inc., Research Triangle Park, N.C.

[21] Appl. No.: 606,437

[22] Filed: Feb. 23, 1996

Related U.S. Application Data

[60] Division of Ser. No. 305,702, Sep. 14, 1994, Pat. No. 5,530,722, which is a continuation-in-part of Ser. No. 967,027, Oct. 27, 1992.

[51] Int. Cl.$^6$ ........................................ H03H 7/06
[52] U.S. Cl. ........................................ 333/172; 333/184
[58] Field of Search ........................................ 333/168, 172, 333/174, 181, 185, 184

[56] References Cited

U.S. PATENT DOCUMENTS

| | | | |
|---|---|---|---|
| 2,967,992 | 1/1961 | Scholten | 323/229 |
| 2,996,689 | 8/1961 | Janz | 333/172 X |
| 3,195,077 | 7/1965 | Barditch et al. | 333/172 |
| 3,602,818 | 8/1971 | Anderlecht et al. | 455/72 |
| 3,603,900 | 9/1971 | Hatori et al. | 333/172 X |
| 3,906,166 | 9/1975 | Cooper et al. | 379/60 |
| 3,949,299 | 4/1976 | Song | 375/250 |
| 4,123,712 | 10/1978 | Mikhael | 333/172 X |
| 4,355,401 | 10/1982 | Ikoma et al. | 375/216 |
| 4,400,585 | 8/1983 | Kaman et al. | 379/63 |
| 4,408,170 | 10/1983 | Rapeli et al. | 333/172 |
| 4,455,676 | 6/1984 | Kaneda | 381/106 |
| 4,493,091 | 1/1985 | Gundry | 375/249 |
| 4,713,808 | 12/1987 | Gaskill et al. | 370/94.1 |
| 4,750,198 | 6/1988 | Harper | 379/59 |
| 4,825,448 | 4/1989 | Critchlow et al. | 375/222 |
| 4,835,792 | 5/1989 | Davarian | 375/324 |

(List continued on next page.)

FOREIGN PATENT DOCUMENTS

| | | |
|---|---|---|
| 0425458 | 5/1991 | European Pat. Off. . |
| 0426560A1 | 5/1991 | European Pat. Off. . |
| 60-46139 | 3/1985 | Japan . |
| 4054012 | 2/1992 | Japan ........................................ 333/172 |

OTHER PUBLICATIONS

R. Fisher, "Dual Mode Mobile Unit For Next Generation Digital Narrow Channel Cellular Telephone System," 38th IEEE Vehicular Tech. Conf., 1988, pp. 543–547.

(List continued on next page.)

*Primary Examiner*—Benny T. Lee
*Assistant Examiner*—Justin P. Bettendorf
*Attorney, Agent, or Firm*—Burns, Doane, Swecker & Mathis, L.L.P.

[57] ABSTRACT

A low pass filter including a number of different filter sections each having two input and two output terminals as well as a common terminal. Each filter section includes first and second resistors connected in series between respective first and second input terminals and first and second output terminals. Each of the resistors is formed by depositing a pattern of resistive material over a conducting plate with an intervening dielectric layer to provide a distributed capacitance between the resistive pattern and the conductive plate. Resistive elements are connected between at least one combination of (1) each of the conducting plates to the common terminal and (2) the conducting plates. A resistor is connected between the output terminals of at least one of the filter sections. The filter sections are cascade connected such that the output terminals in one section are connected to the input terminals of the next. Additionally, a step-wise adjustable notch frequency filter is disclosed to include at least one input and one output terminal and a ground terminal. A number of resistive elements are constructed as thin films and deposited over a corresponding number of conducting plates with an intervening dielectric layer. A number of switches are arranged to selectively bypass certain of the resistive elements and a corresponding number of switches are arranged to be able to selectively connect together certain of the connecting plates associated with the unbypassed resistor elements to a common terminal which is connected through resists to the ground terminal.

16 Claims, 7 Drawing Sheets

U.S. PATENT DOCUMENTS

| | | | |
|---|---|---|---|
| 4,850,033 | 7/1989 | Eizenhöfer et al. | 455/33.2 |
| 4,857,915 | 8/1989 | Andros et al. | 340/825.44 |
| 4,903,319 | 2/1990 | Kasai et al. | 455/33.2 |
| 4,903,320 | 2/1990 | Hanawa | 455/34.2 |
| 4,989,230 | 1/1991 | Gillig et al. | 379/59 |
| 4,996,696 | 2/1991 | McCabe | 375/249 |
| 5,008,925 | 4/1991 | Pireh | 379/60 |
| 5,020,076 | 5/1991 | Cahill et al. | 375/216 |
| 5,020,093 | 5/1991 | Pireh | 379/59 |
| 5,029,233 | 7/1991 | Metroka | 455/11.1 |
| 5,048,059 | 9/1991 | Dent | 375/340 |
| 5,079,550 | 1/1992 | Sooch et al. | 341/143 |
| 5,084,669 | 1/1992 | Dent | 324/76.82 |
| 5,119,397 | 6/1992 | Dahlin et al. | 375/216 |
| 5,124,703 | 6/1992 | Kaneaki et al. | 341/77 |
| 5,150,362 | 9/1992 | Akerberg | 370/95.1 |
| 5,163,159 | 11/1992 | Rich et al. | 455/74 |
| 5,189,593 | 2/1993 | Ooi | 455/195.1 |
| 5,220,275 | 6/1993 | Holmqvist | 324/76.82 |
| 5,243,346 | 9/1993 | Inami | 341/144 |
| 5,251,232 | 10/1993 | Nonami | 375/216 |
| 5,293,406 | 3/1994 | Suzuki | 375/295 |

OTHER PUBLICATIONS

Nobuaki Imai et al., "An Extremely Accurate Quadrature Modulator IC Using Phase Detection Methid and Its Application to Multilevel QAM Systems," IEICE Transactions on Electronics, vol. E75–C, No. 6, (Jun. 1992), pp. 674–682.

"Audio compander squelches hiss and hum better than Dolby system", *Electronics,* vol. 52, No. 4, Feb. 15, 1979, pp. 70, 72.

Tarallo et al., "Modulation Techniques for Digital Cellular Systems," 38th IEEE Veh. Tech. Conf., 1988, pp. 245–248.

Motorola, "DYNA T–A–C 6000X Universal Mobile Telephone," 1984, (379/59).

IEEE Communications Magazine, "Trends in Cellular and Cordless Communications", D.J. Goodman, Jun. 1991, pp. 31–40 (379/59).

Ericsson Review, "Introduction of Digital Cellular Systems in North America", F. Lindell and K. Raith, No. 2, 1990, vol. 67 (379/59).

Global News, "Hughes Network Systems Jumps in the Cellular Arena with GM Backing", Feb. 1991, pp. 15–16.

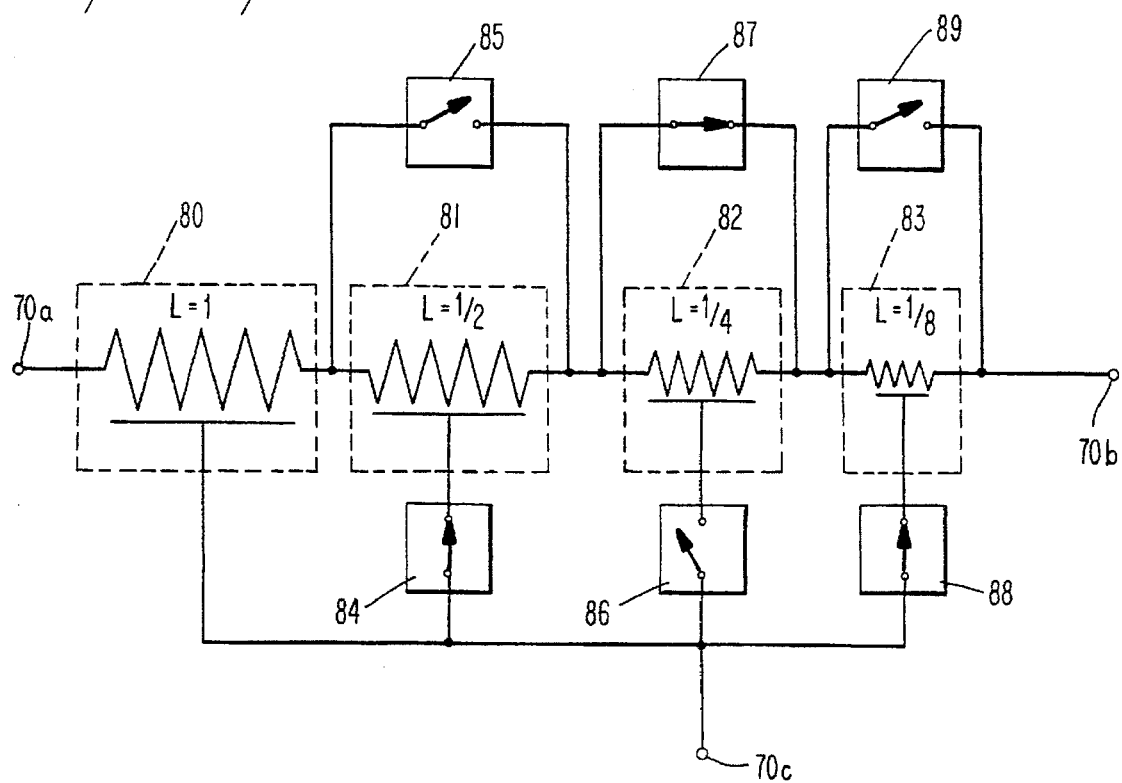
Fig. 8
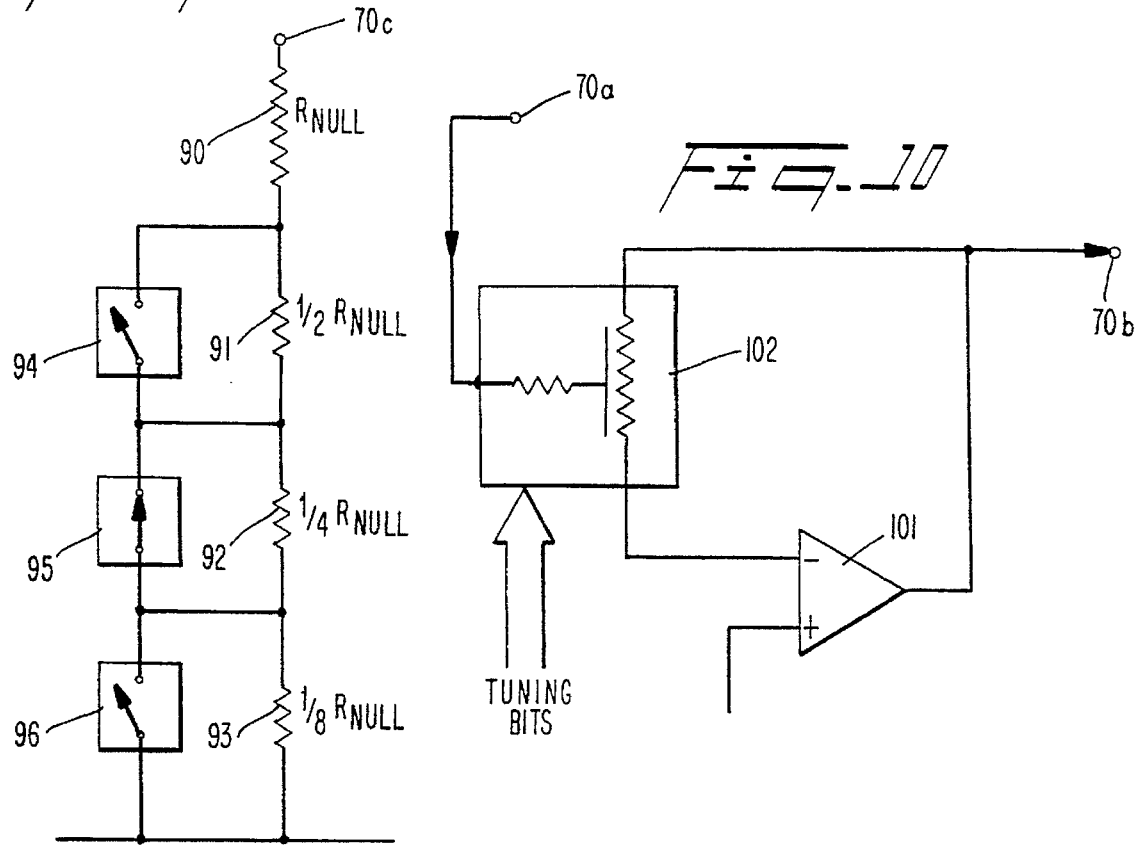
Fig. 9
Fig. 10

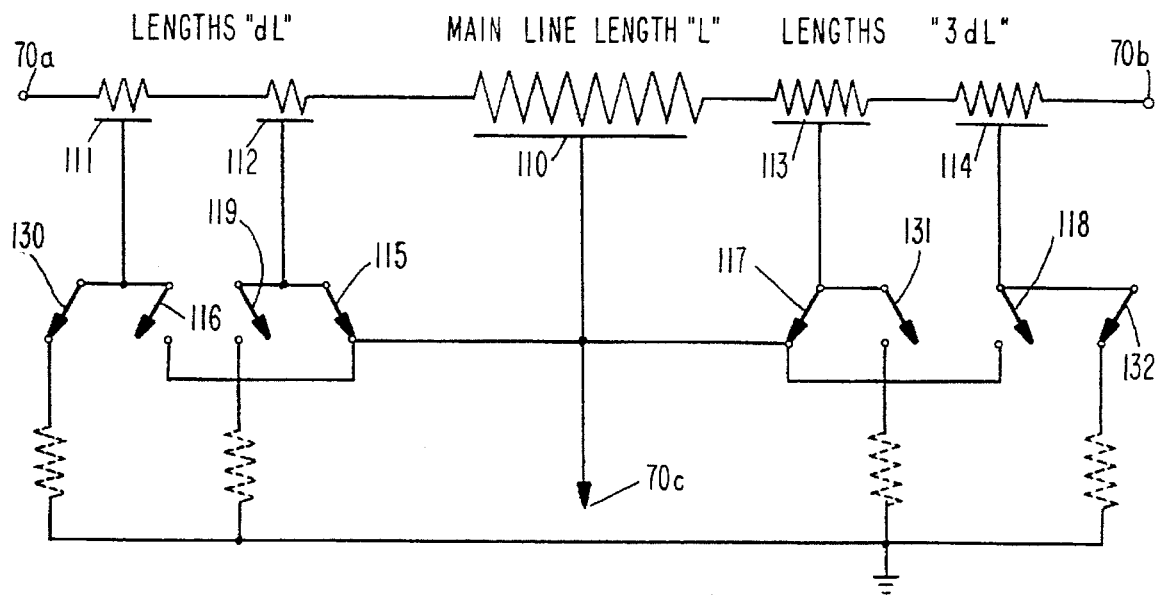
Fig.11
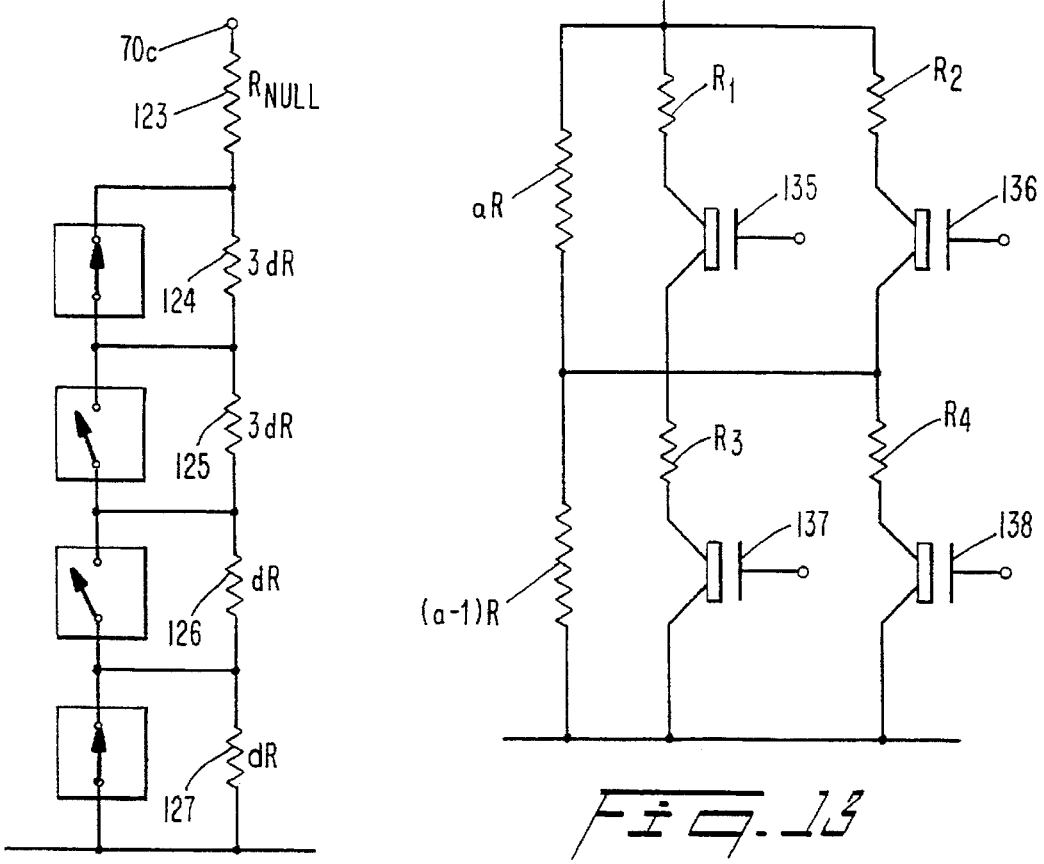
Fig.12
Fig.13

INTEGRATED DISTRIBUTED RC LOW-PASS FILTERS

This application is a divisional of application Ser. No. 08/305,702, filed Sep. 14, 1994, now U.S. Pat. No. 5,530,722 which is a continuation-in part of application Ser. No. 07/967,027, filed Oct. 27, 1992.

BACKGROUND

1) Field of the Invention

The invention relates to methods and apparatuses for the realization of frequency band-stop, band-pass and low pass filters as integrated circuit elements on a silicon chip for use in a quadrature modulator which can generate complex modulated radio signals.

2) Discussion of Related Art

The prior art for the construction of frequency selective filters includes: (1) passive inductor-capacitor filters; (2) passive resistor-capacitor filters; (3) active RC filters; (4) distributed RC filters; (5) gyrator-capacitor filters; (6) transmission line or waveguide filters; (7) switched capacitor filters; and (8) digital filters, each of which is discussed below.

The construction of inductor-capacitor filters on a silicon chip is constrained by the very small inductance values that can be achieved with spiral metallization patterns within a frequency range above about 2 GHz.

Passive resistor-capacitor filters can only synthesize a limited subset of the possible frequency responses that might be required, and at low frequencies are limited by the available RC product that can be made while also being limited at high frequencies by stray (parasitic) capacitance and resistance.

Active RC filters can provide useful performance up to a few megahertz, but are limited by the performance and bandwidth of amplifiers as well as the parasitic effects mentioned above. Unfortunately, the amplifiers consume power and limit the dynamic range.

Distributed RC filters are, on the other hand, inherently based on the parasitic capacitance and resistance parameters, such as described in "Tidskontinureliga Lågpass Filteri CMOS", by Katarina Hansson and Mats Torkelsson, LUTEDX/(TETE–7029)/pp. 1–26 (1987).

Gyrator-capacitor filters use an active impedance inverting circuit to make a capacitor function as an inductor, so that LC equivalent filters may be built. These circuits are useable for bandpass filters up to a few megahertz. The Gyrator-Capacitor filter can be classed as a form of active RC filter.

Transmission line or waveguide filters require elements that are typically a quarter wavelength long so their construction on a chip is limited to the micro-wavelengths above 2 GHz.

Switched capacitor filters operate according to a number of different principles, but all require transistor switches to operate at a very much higher frequency than the operating frequency range of the filter. This restricts their use to a few hundred kilohertz. Moreover, the dynamic range of switched-capacitor filters is limited by their high noise levels.

Digital filters are very flexible in the frequency response repertoire they can realize, and have the advantage of no tolerances. On the other hand, the signal to be filtered must first exist in digital form and the required analog-to-digital convertors restrict both the dynamic range and speed. Digital logic power consumption is also a factor which restricts such filters to the 300 kHz region or below in practical applications.

The frequency range upon which the present invention focusses is the 0.3 MHz to 300 MHz region. This is above the range of most of the techniques mentioned while being below the range for transmission line solutions. Hitherto there has been no practical silicon-integrable solution for these three decades of frequency, which encompass virtually the entire radio communications frequency spectrum. Accordingly, the present invention was conceived to address this important range of frequencies. The present invention makes use of concepts of the distributed RC techniques mentioned above.

SUMMARY

The present invention relates to methods and apparatuses for the realization of frequency band-stop, band-pass and low pass filters as integrated circuit elements on a silicon chip.

The inventive method allows the manufacture of continuous-time, analog filters in frequency ranges not conveniently covered by other, known techniques. Such filters are typically required in the generation of complex-modulated radio signals with the aid of digital signal processors and quadrature modulators. The inventive filters are aimed to be suitable for construction as part of integrated circuits for analog or mixed analog/digital radio communications signal processing applications.

In the present invention, new distributed RC filter structures and applications are disclosed, and in particular, means to overcome the problems created by manufacturing tolerances in the resistive and dielectric layer properties. The distributed RC filter structure include means for selectively switching in and out of the circuit incremental RC lines and for selectively switching in and out of the circuit incremental hulling resistors. Several embodiments are disclosed.

BRIEF DESCRIPTION OF THE DRAWINGS

The invention will now be described with reference to the accompanying drawings in which:

FIG. 1b is the circuit symbol for a distributed RC line filter such as shown in FIG. 1a;

FIG. 7 is a schematic diagram of a complete balanced filter in accordance with the present invention;

FIG. 8 is a schematic diagram of a stepwise-adjustable RC line in accordance with the present invention;

FIG. 9 is a schematic diagram of a switched hulling resistor combinable with the switched RC line of FIG. 8 in accordance with the present invention;

FIG. 10 is a schematic diagram showing the use of an adjustable notch filter according to the present invention in a feedback loop for obtaining an adjustable bandpass amplifier response;

FIG. 11 is a schematic diagram of a preferred arrangement of a switched-tunable $RC_{NULL}$ device in accordance with the present invention;

FIG. 12 is one possible stepwise-adjustable nulling resistor for use with the switched-tunable $RC_{NULL}$ device shown in FIG. 11 in accordance with the present invention;

FIG. 13 is a schematic diagram of a preferred arrangement of a stepwise-adjustable nulling resistor for use with the switched-tunable $RC_{NULL}$ device shown in FIG. 11 in accordance with the present invention.

DETAILED DESCRIPTION OF THE PREFERRED EMBODIMENTS

Figure 1A:
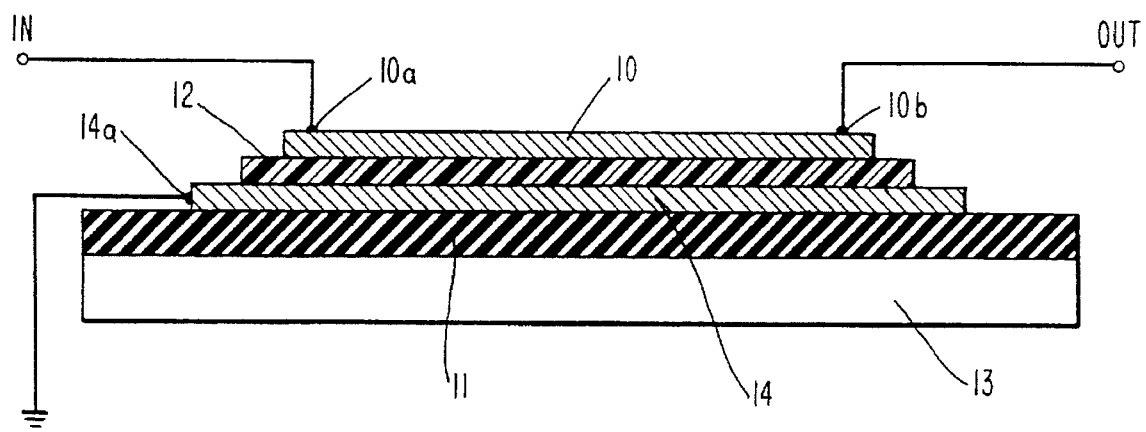
FIG. 1a is a partially schematic diagram of the structure of a distributed RC line in accordance with the present invention.

The inventive filter construction includes a distributed RC line as shown in FIG. 1a which utilizes the sheet-resistivity properties of deposited conductive films such as a polysilicon film resistive filter 10, and the capacitance-per-unit-area properties between the resistive filter 10 and a conductive plate 14 (connected to a common by a connection point 14a) with a thin dielectric layer 12 interposed between the layers 10 and 14. The resistive filter 10 includes an input connection point 10a and an output connection point 10b.

In order of the layers' appearance from substrate to top level, the filter is composed of a substrate 13 comprising, e.g., silicon, alumina, gallium arsenide, sapphire or polyamide, an insulating film 11 comprising silicon dioxide, alumina, gallium arsenide, sapphire, polyamide, etc., a conductive plate 14 of heavily doped polysilicon, aluminum, gold or the like, a thin film dielectric layer 12, and a resistive filter 10 composed of polysilicon or the like.

Resistors formed by the polysilicon film 10 are treated as distributed over and insulated from a capacitor plate 14 and, thus, as a distributed RC line that may be described by the resistance per unit length, capacitance per unit length, and length.

Figure 1B:
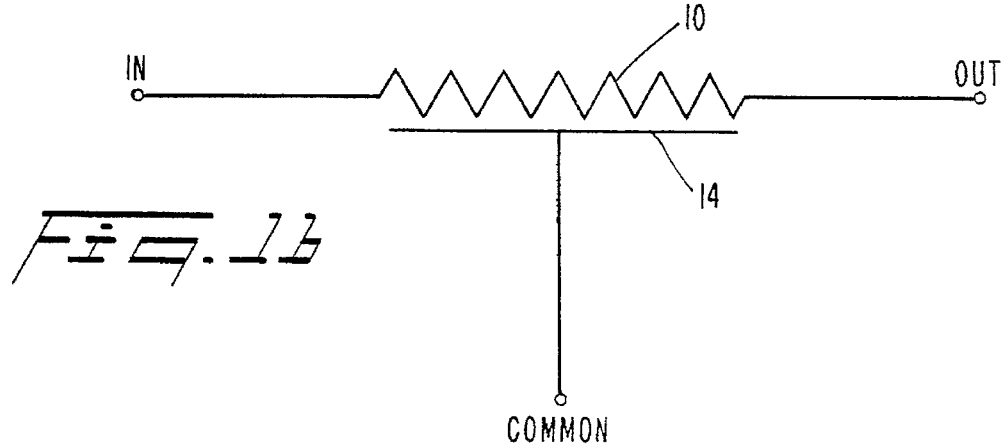

The circuit symbol for a distributed RC line is shown in FIG. 1b.

Such RC lines have an inherent low-pass type of frequency response that attenuates higher frequencies, but the cut-off is rather gentle. Sharper cut-off low-pass filters generally achieve their characteristics with the aid of notches in the stop band.

Figure 2:
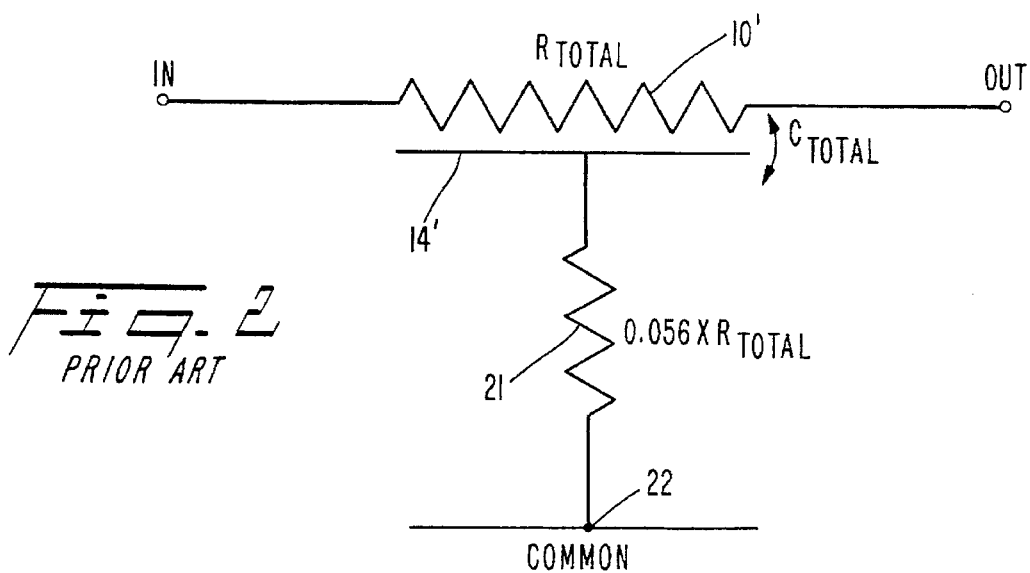
FIG. 2 is a schematic diagram of a prior art distributed $RC_{NULL}$ device.

A notch in the frequency response may be formed using a distributed RC line by connecting its capacitor plate 14' terminal to ground 22 through a resistor 21 of specific value, such as shown in FIG. 2. For uniform RC lines, the notch is complete when the resistor connected to ground has the approximate value 0.056 times the total through-resistance Rtot of the resistive filter 10', and the notch frequency is approximately 11.2/RC radians per second where Rtot is the total through-resistance and C is the total distributed capacitance.

Once a complete or partial notch can be formed, other frequency responses can be synthesized, such as bandstop, or bandpass, the latter by including the notch device in the feedback loop of an amplifier such as shown in FIG. 10, discussed below.

According to a first aspect of the invention, matched, balanced, lowpass filters are provided in conjunction with a so-called quadrature modulator for the purposes of synthesizing an arbitrarily modulated radio frequency signal.

According to a second aspect of the invention, means to overcome the high production process spreads (i.e.; deviation from ideal values on resistive and dielectric layer properties) are provided. In some processes, typical spreads on the sheet resistivity and capacitance per unit area parameters can be up to 15% on capacitance and as much as 100% max/min ratio on sheet resistivity. Without the inventive means, the notch frequency given by the RC product could not be guaranteed to within an octave. The inventive means can be used to bring the notch frequency within a desired tolerance when such processes are used. The present invention achieves this by effectively providing a stepwise-variable line length that can be programmed in-circuit to set the filter frequency to a desired value.

Figure 3:
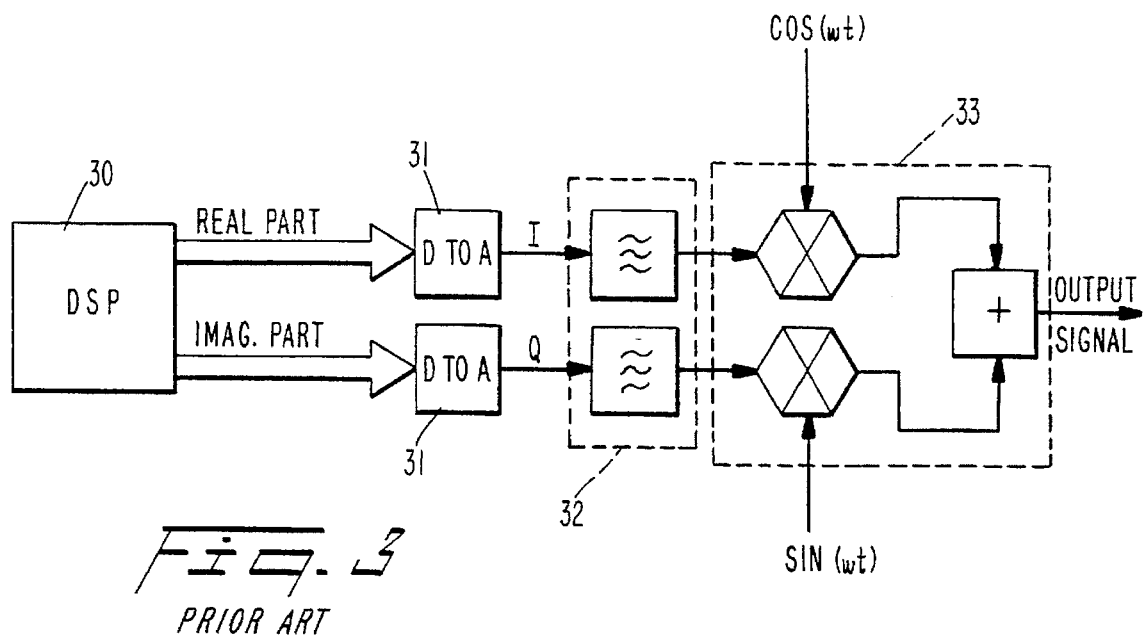
FIG. 3 is a schematic diagram of a prior art quadrature modulator arrangement for synthesizing an arbitrary modulated signal.

FIG. 3 shows a prior art arrangement of a quadrature modulator for synthesizing an arbitrarily modulated signal. A digital signal processor (DSP) 30 calculates time-spaced samples of the real and imaginary parts of a desired complex modulation. The real part is given by the desired amplitude times the cosine of the desired phase angle, while the imaginary part is given by the amplitude times the she of the phase angle. In this way both Amplitude Modulated (AM) signals or Phase Modulated (PM) signals can be generated, or signals comprising both, the result of which is generally known as complex modulated signals. The numerical samples calculated by the DSP 30 are transferred to a pair of Digital-to-Analog (D-to-A) convertors 31 that convert each numerical sample pair into a pair of analog voltages known as I (In-phase) and Q (Quadrature) signals. A sequence of such numerical samples generates I and Q waveforms but in a stepwise fashion.

The steps in the waveforms cause undesirable spectral components that would interfere with adjacent radio channels unless suppressed. Some techniques for D-to-A conversion provide interpolation between samples giving sloping waveforms between adjacent sample values, which reduces but does not sufficiently eliminate the undesired components. Consequently, I and Q smoothing filters 32 are necessary. These are low-pass filters that pass all modulation spectral components of interest but suppress the higher frequency components of the spectrum associated with the stepwise or piecewise linear I, Q waveforms from the D-to-A convertors 31.

The smoothed I, Q waveforms are applied to a pair of balanced modulators 33 together with cosine and sine carrier frequency signals, this arrangement being known as a quadrature modulator. The arrangement described so far and illustrated in FIG. 3 belongs to the well-known prior art.

It is important for accurate signal generation that (1) the two balanced mixers are accurately matched, (2) the levels of the I and Q signals are accurately controlled relative to each other, and (3) the balanced mixers have low carrier leakage or offset, that is, the output signal of a balanced modulator should be zero when its respective I or Q modulating signal is zero.

Since the I and Q signals vary from positive to negative, if a circuit is required to operate only from a single positive supply, then the zero point of an I or Q waveform cannot be defined to be zero voltage, but must be defined to be some positive reference voltage such as half the supply voltage. Then when an I or Q waveform swings below this reference voltage it will be interpreted as negative, and positive when it swings above.

Unfortunately, it is difficult to generate a reference voltage from the DSP 30 that is exactly equal to the voltage the D-to-A convertors supply with an input numerical value of zero. This problem is overcome in the invention by use of the balanced configuration shown in FIG. 4, which uses special D-to-A conversion techniques to generate I and Q signals as well as their complements $\overline{I}$ and $\overline{Q}$.

Figure 4:
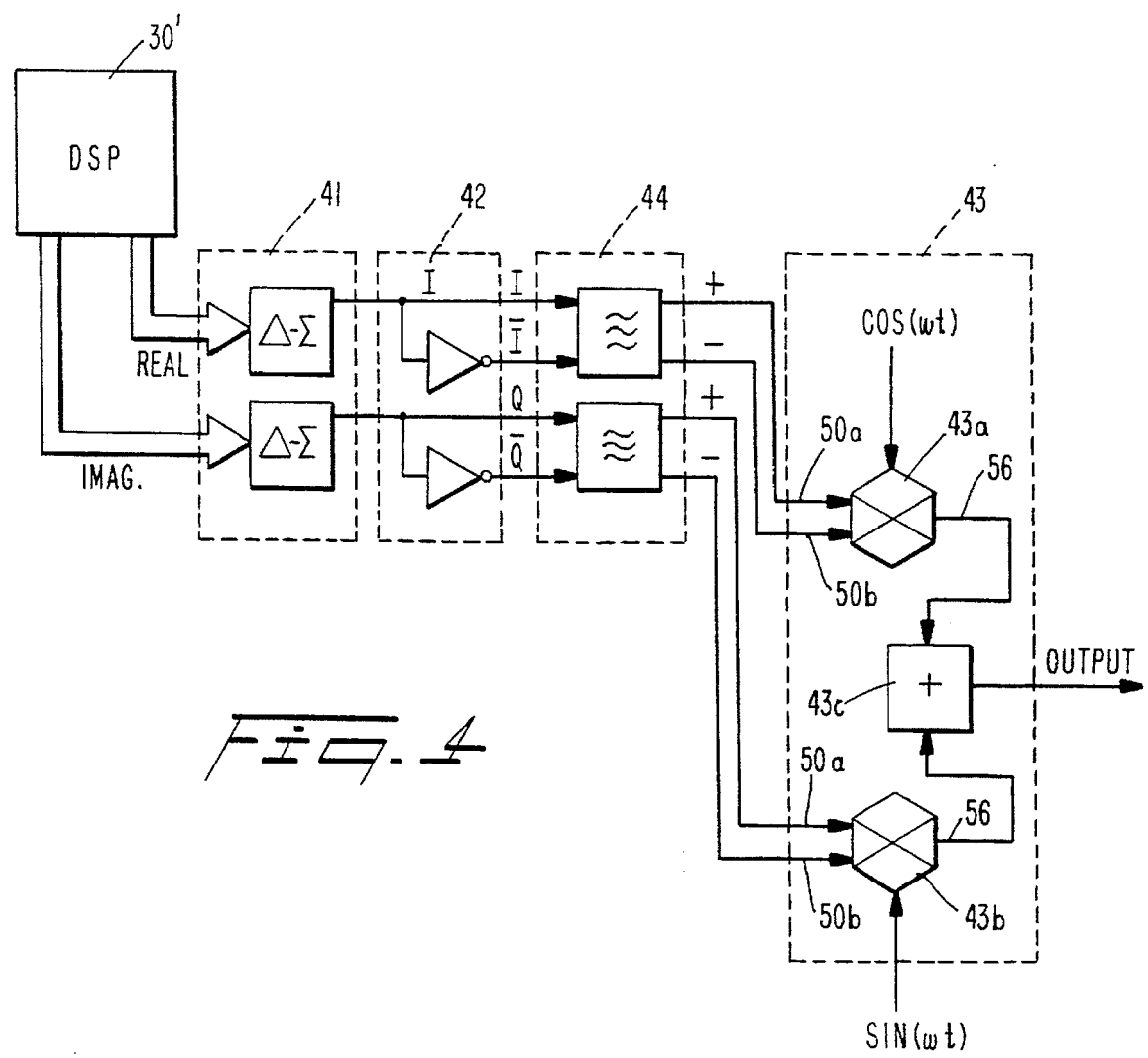
FIG. 4 is a schematic diagram of a quadrature modulator arrangement in accordance with the present invention.

In accordance with the present invention as shown in FIG. 4, the numerical I and Q signals from DSP 30' are transferred to a delta-sigma($\Delta\Sigma$) convertor 41. This device is built according to known art to generate a high bitrate stream of binary '1's and '0's having a short-term average value proportional to the numerical input value. With a maximum possible numerical input value the bit stream produced would be 11111 . . . (the voltage of a '1'condition being equal to the chosen supply voltage) while the minimum numerical input value will generate the bit pattern 0000 . . . . A half-scale numerical input will produce the bit stream 1010101010 . . . having an average voltage equal to half the supply voltage. According to an aspect of the present invention, extra invertor gates 42 are provided at the output of each delta-sigma convertor 41 to additionally generate the complementary bitstreams. That means when delta-sigma convertors 41 produce a bit stream 100100100100 . . . having a mean of ⅓ the supply voltage, the complementary bit stream will be 011011011011 . . . having a mean of ⅔rds the supply voltage. The difference between these two is ⅓−⅔=−⅓ of the supply voltage. If the convertor produces 111011101110 . . . having a mean of+¾ of the supply voltage then the complementary signal 000100010001 . . . will have the mean ¼, so that the difference is ¾−¼=+½ supply. Consequently, by using the difference between the convertor output signal and its complement to represent an I or Q signal, the value represented can be positive or negative even with a single positive voltage supply, and no reference voltage need be generated. The balanced mixers 43a and 43b are therefor provided with balanced, two-wire inputs rather than single-ended inputs, that are responsive to the difference in the signals on the two wires and unresponsive to the absolute or common-mode voltage (sum of the voltages) on the two wires.

High bitrate delta-sigma modulation bitstreams are simply converted to the analog voltage they represent by forming the moving average voltage over a large number of bits. This may be done using a continuous-time, low-pass filter having a bandwidth which is a small fraction of the bitrate, but still sufficient to pass all desired modulation components. For the balanced signal configuration developed in this invention, balanced filters 44 are interposed between the delta-sigma convertor outputs and the I, Q balanced modulators 43.

Figure 5:
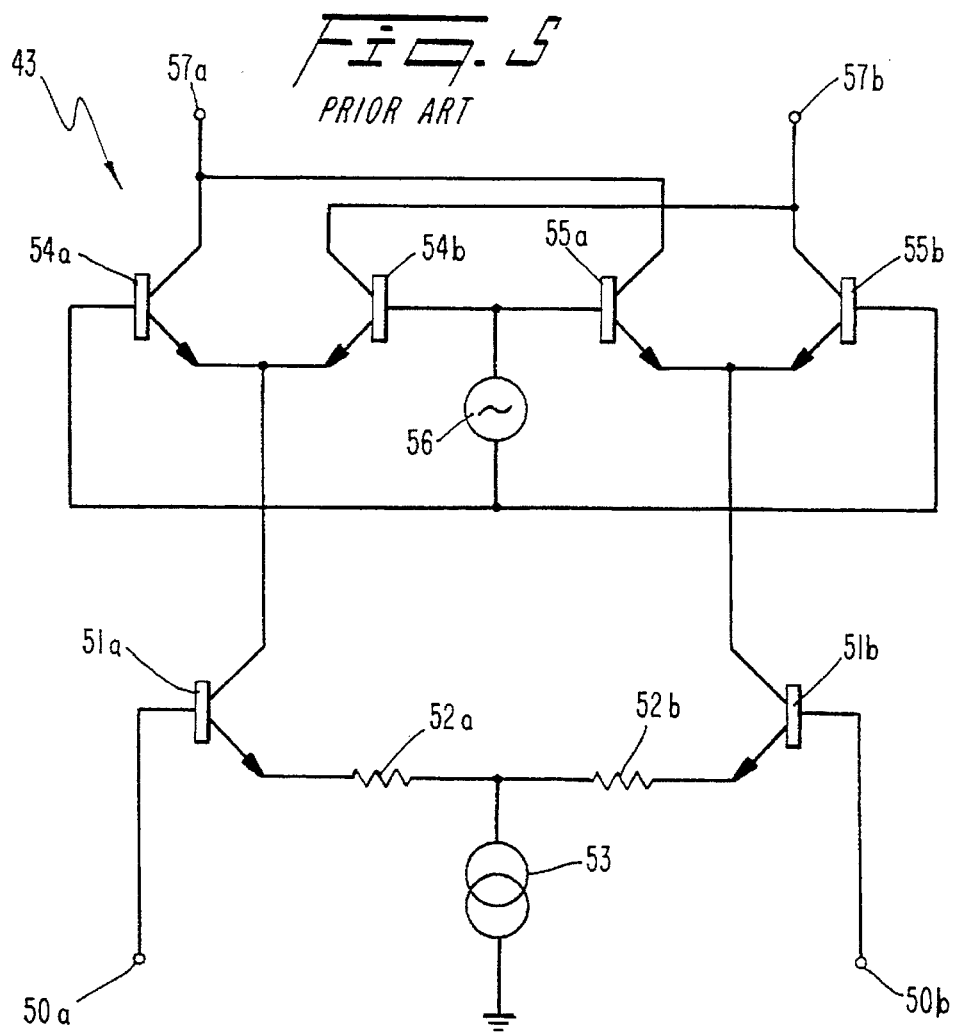
FIG. 5 is a schematic diagram showing prior art Gilbert mixers as balanced modulators.

The balanced modulators 43 may include so-called Gilbert mixers 43a and 43b such as shown in FIG. 5. As shown in FIG. 5, the balanced I or Q inputs 50a and 50b of the Gilbert mixers is applied to the bases of two transistors 51a and 51b. The emitters of the two transistors 51a and 51b are commonly connected through respective resisters 52a and 52b to a common bias current source 53. Each of the collectors to the two transistors 51a and 51b are respectively connected to a pair of commonly connected emitters of two pairs of transistors 54a, 54b and 55a, 55b. The base of one transistor 54a, 55b from each of the transistor pairs 54 and 55 are commonly connected to one side of a cosine or sine signal generator 56, with the other base of one transistor 54b, 55a of each of the transistor pairs 54 and 55 being commonly connected to the other side of the cosine or sine generator 56. The collectors of one transistor of each of the two transistor pairs 54a, and 55a are commonly connected to one output line 57a, with the other collectors of one FET of each of the two transistor pairs 54b and 55b being commonly connected to the other output line. These balanced modulators can be formed in the same substrate as the balanced low pass filters.

The outputs of the balanced modulators 43a and 43b of FIG. 4 are added together by an adder 43c, to result in a complex modulated radio signal.

The balanced I or Q input signals swing around a mean voltage of half the supply (e.g., around 2.5 volts for a 5 volt supply) but the amplitude of the peak-to-peak voltage excursions should be somewhat less, for example, ±—250 mV. The delta-sigma convertor output, however, can at its extremes swing between 0 and 5 volts on each output line or its complement, and therefore a 1/20 attenuation of the balanced mode signal is called for while no attenuation of the common mode voltage (2–5 volts) is required in this embodiment.

Figure 6:
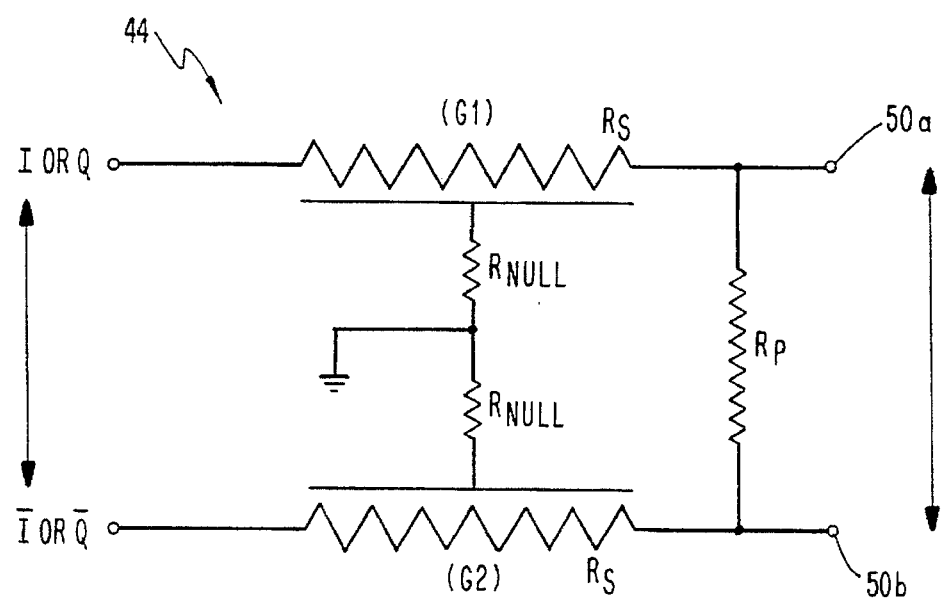
FIG. 6 is a schematic diagram of a section of a balanced filter in accordance with the present invention.

A basic filter section 44 according to the invention which accomplishes the appropriate attenuation of the balanced mode signal is shown in FIG. 6. Two identical $RC_{NULL}$ devices 61, 62 provide a low-pass filtering action to both balanced (push-pull) and common mode signals, with a notch in the frequency response.

Figure 1:
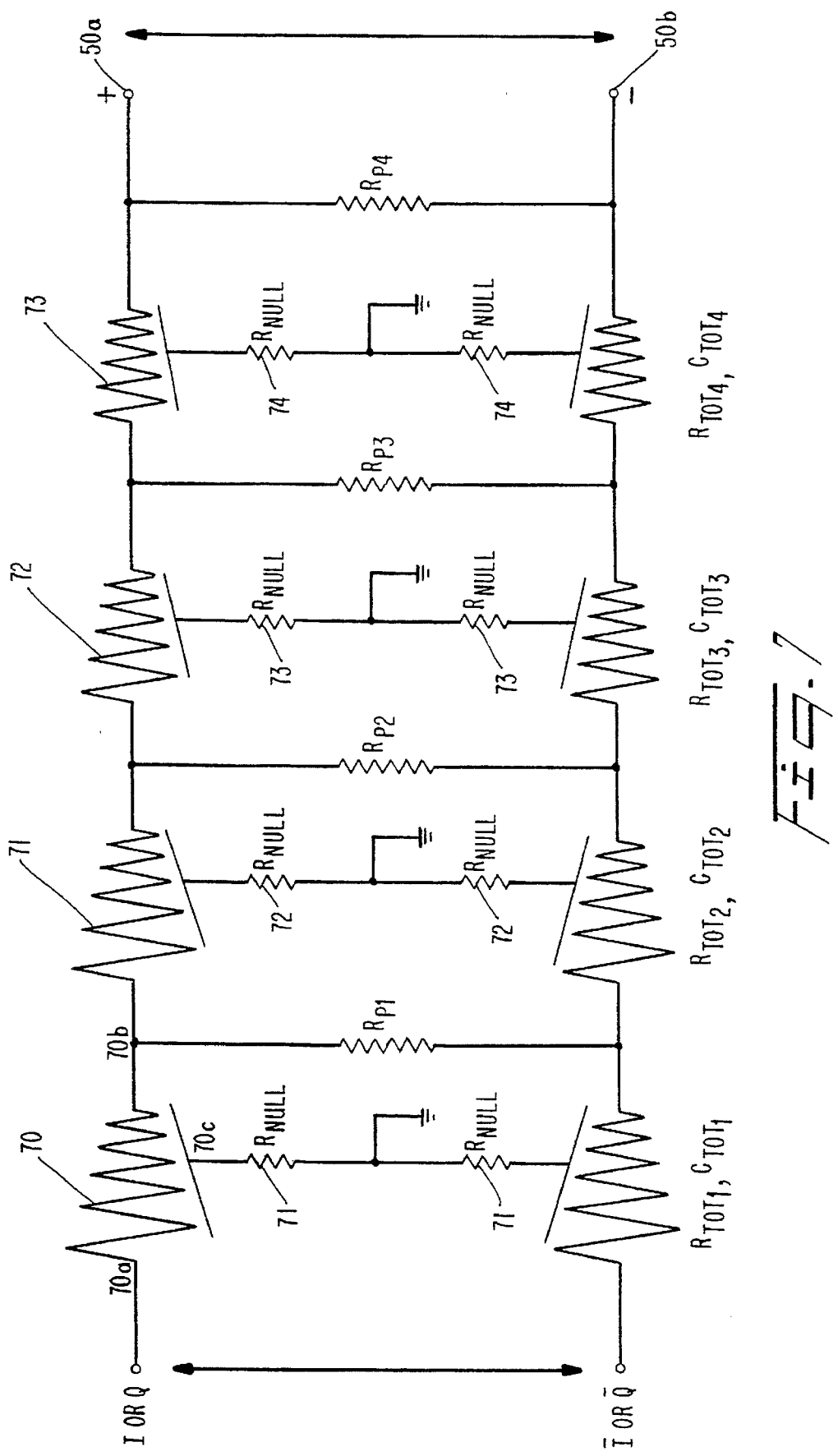

The balanced filter includes two input terminals for I, $\overline{I}$ or Q, $\overline{Q}$, 6, and two output terminals 50a and 50b, and a common terminal connected to ground. A series resistor Rs is connected between an input terminal I or Q and an output terminal 50a, and an identical resistor Rs is connected between a second input terminal Q or $\overline{Q}$ and a second output terminal 50b. Each of the resistors Rs can be formed by depositing a pattern of resistive material over respective conducting plates with an intervening dielectric layer, such as shown in FIG. 1, to provide distributed capacitance between the resistive pattern and the conductive plate.

A resistor or resistors $R_{NULL}$ are connected between each of the conducting plates to the common terminal, or between the conducting plates, or both. A shunt resistor Rp is connected between the output terminals of at least one of the filter sections (when cascaded, as discussed below with reference to FIG. 7).

This filter 44 has a common mode attenuation of unity at direct current and low frequencies, as there is no resistance to ground. In other words, the pair of balanced, lowpass filters attenuate to a different degree, or not at all, the common mode signal defined as the sum of the voltages on the two input lines or two output lines, compared to the balanced mode defined as the difference of the voltages on the two input or output lines. In the balanced mode, the attenuation is Rp/(2Rs+Rp) due to the resistor Rp connected between the output terminals. This may be set to 1/20 or other desired value less than unity by choice of the shunt resistor Rp relative to resistive filter Rs. The desired value is defined as the difference in voltages between the two input lines or the two output lines.

Another effect of the shunt resistor Rp is to emphasize the high frequency response in the balanced mode relative to the low frequency response, as the high frequency attenuation tends to unity. This has the desirable effect of sharpening up the rate of cutoff. The rate of cutoff may be further sharpened by exponential tapering of the RC line.

Figure 14:
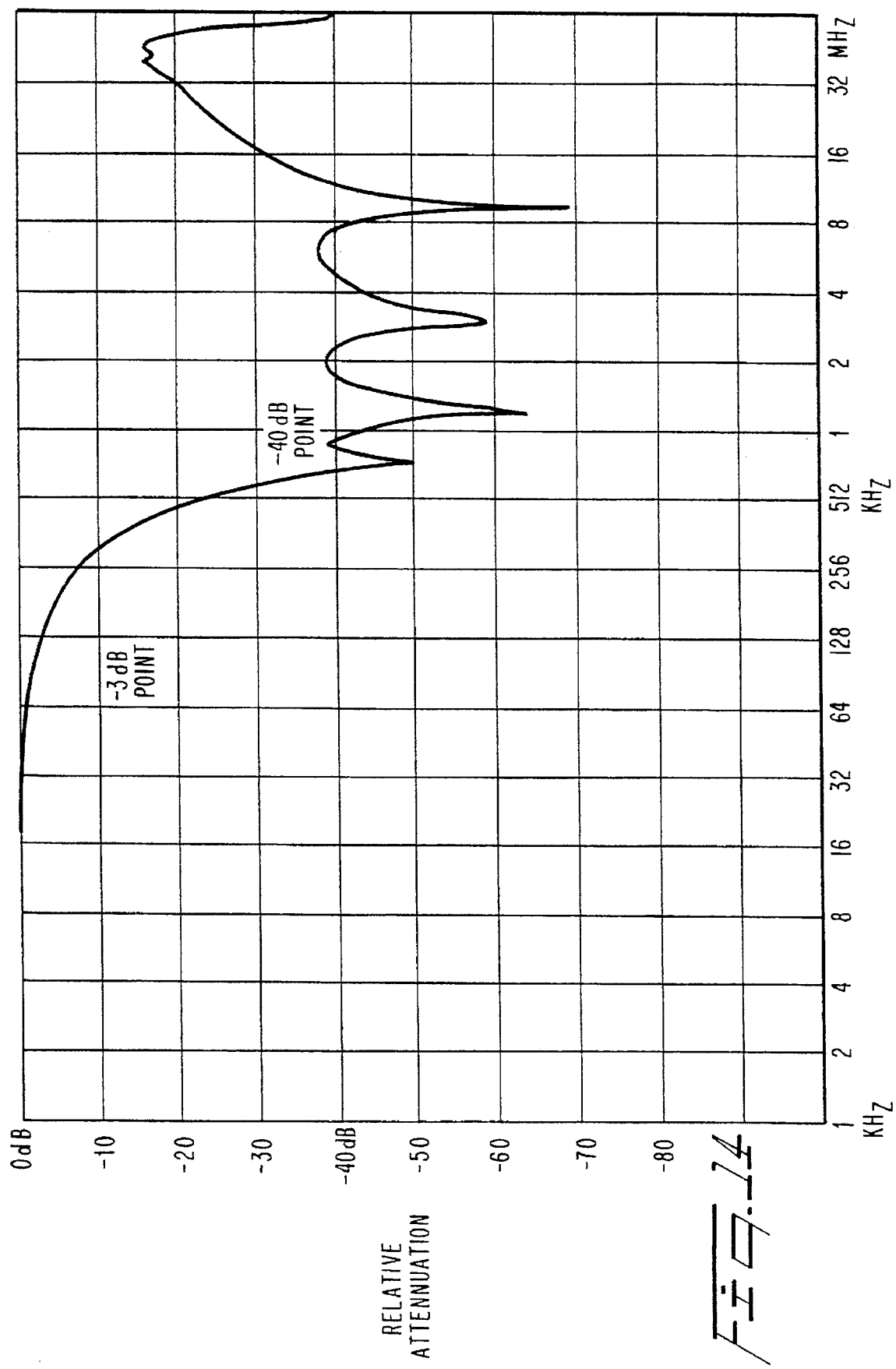
FIG. 14 is a graph of the frequency response of the filter shown in FIG. 7.

A complete filter design consisting of a cascade of such balanced sections is shown in FIG. 7. A series of balanced $RC_{NULL}$ devices 70, 71, 72, 73, each characterized by a starting line width, an exponential tapering factor (MAX/MIN width ratio), a total resistance Rtot and a total capacitance Ctot are cascade connected by depositing distributed RC lines having resistive patterns deposited over a conductive plate over an intervening dielectric film on a substrate, such as shown in FIG. 1. Shunt resistors Rp1, Rp2, Rp3, Rp4 are connected between the output terminals of each section to provide graduated attenuation. The total attenuation in the balanced mode is set to the desired value by choice of these shunt resistors, but there is a continuum of ways to do the ranging from all attenuation in the first section Rp1 to all attenuation in the last section Rp4. An optimum distribution of the attenuation between the sections can be found by trial and error using computer simulation which gives the sharpest rate of cutoff. Likewise, an optimum set of line widths and tapers can be found within constraints on minimum line width and maximum allowed filter area that gives the sharpest rate of cutoff. The values of a near optimum design for a cutoff frequency of 150 kHz are shown in Table 1 and its resulting frequency response is shown in FIG. 14.

TABLE 1

| | | |
|---|---|---|
| 70 | $W_{MAX71}$ | LINE WIDTH AT THICK END = 20.00000 MICRONS |
| | | TAPERING FACTOR = 20.00000 |
| | $R_{TOT71}$ | TOTAL RESISTANCE = 118.83687 k$\Omega$ |
| | $C_{TOT71}$ | TOTAL CAPACITANCE = 47.53474 pF |
| | $R_{NULL71}$ | NULLING RESISTOR = 3.16380 k$\Omega$ |
| | | ATTENUATION FACTOR = 1.41410 |
| | $R_{P71}$ | SHUNT ATTENUATION RESISTOR = 286.97623 k$\Omega$ |
| 71 | $W_{MAX72}$ | LINE WIDTH AT THICK END = 1.01000 MICRONS |
| | | TAPERING FACTOR = 1.010000 |
| | $R_{TOT72}$ | TOTAL RESISTANCE = 271.01572 k$\Omega$ |
| | $C_{TOT72}$ | TOTAL CAPACITANCE = 5.47452 pF |
| | $R_{NULL72}$ | NULLING RESISTOR = 15.22687 k$\Omega$ |
| | | ATTENUATION FACTOR = 2.82820 |
| | $R_{P72}$ | SHUNT ATTENUATION RESISTOR = 194.20894 k$\Omega$ |
| 72 | $W_{MAX73}$ | LINE WIDTH AT THICK END = 1.01000 MICRONS |
| | | TAPERING FACTOR = 1.01000 |
| | $R_{TOT73}$ | TOTAL RESISTANCE = 171.40543 k$\Omega$ |
| | $C_{TOT73}$ | TOTAL CAPACITANCE = 3.46239 pF |
| | $R_{NULL73}$ | NULLING RESISTOR = 9.63032 k$\Omega$ |
| | | ATTENUATION FACTOR = 4.00000 |
| | $R_{P73}$ | SHUNT ATTENUATION RESISTOR = 98.98187 k$\Omega$ |
| 73 | $W_{MAX74}$ | LINE WIDTH AT THICK END = 1.01000 MICRONS |
| | | TAPERING FACTOR = 1.01000 |
| | $R_{TOT74}$ | TOTAL RESISTANCE = 98.96096 k$\Omega$ |
| | $C_{TOT74}$ | TOTAL CAPACITANCE = 1.99901 pF |
| | $R_{NULL74}$ | NULLING RESISTOR = 5.56007 k$\Omega$ |
| | | ATTENUATION FACTOR = 1.25000 |
| | $R_{P74}$ | SHUNT ATTENUATION RESISTOR = 692.78949 k$\Omega$ |

A practical problem is how to control in mass production the resistivity of the deposited films to be equal to the target value assumed in the design. If the resistivity varies, the whole frequency response scales proportionally. For example, double the resistivity would halve the cutoff and null frequencies while half the resistivity would double all frequencies. In the case where practical production tolerances are too wide to permit the frequency response to be held within desired limits, the second aspect of the invention may be applied to adjust the frequency response to be within limits after manufacture. This is done by means of an inventive means for stepwise variation of the line length.

A first configuration according to this aspect the invention is shown in FIG. 8. It is to be understood that the circuit of FIG. 8 can replace any of resistive lines of the balanced null devices 70, 71, 72, 73 shown in FIG. 7.

The step-wise-adjustable line or notch frequency filter includes at least one input 70a, at least one output 70b and a common terminal 70c. A number of resistive elements 80, 81, 82 and 83 may be formed as thin films deposited over a corresponding number of conducting plates with an intervening dielectric layer, such as shown in FIG. 1. The resistive elements are connected in series between the input 70a, and output 70b terminals.

A number of switches 85, 87, 89 are arranged to be able to selectively bypass or shortout a respective resistive element. A corresponding number of switches 84, 86, 88 are arranged to be able to selectively connect together respective conducting plates with resistive elements which have not been bypassed and hence through a resistance connected to common terminal 70c. The value of the series connected resistances is changed according to which of the resistive elements is bypassed.

An RC line 80 of a normalized length of one unit is permanently in circuit, while other RC lines 81, 82, 83 of lengths, for example, ½, ¼, ⅛, etc., units may be switched in or out of circuit by switching selected paris of switches 84, 85; 86, 87; and 88, 89. The effective line length may thus be switched between the values 1, 1.125, 1.25, 1.375, 1.5, 1.625, 1.75, and 1.875 in this example. Since increasing the length increases both the total through-resistance and capacitance, the RC product follows the square of these values, and thus is controlled over almost a 4:1range.

If it is only desired to vary the RC product over a 2:1range, the maximum line length need only be root(2)= 1.414 times the minimum line length and this is achievable with switched sections of length 0.207, 0.1035, 0.052 units, etc. With only three such switched sections, 5% line-length steps corresponding to 10% frequency steps are achievable, and if the nearest frequency step to a desired value is selected, the error is only ±5%.

To create a tunable notch filter with the above arrangement, the resistor from the capacitor plate to ground is also varied to maintain a certain fraction (e.g., 0.056) of the through-resistance. Thus, a switched resistor to ground is also used, such as shown in FIG. 9 for example. It is to be understood that the switched nulling resistor circuit of FIG. 9 can replace one or more of the resistors $R_{NULL71}$ through $R_{NULL74}$ Of FIG. 7.

As shown in FIG. 9, the switched nulling resistor usable in conjunction with the circuit of FIG. 8 includes a first, non-switchable null resistor 90 with a relative value $R_{NULL}$, to which is connected one end of three series connected null resistances 91, 92, and 93. The three null resistances 91, 92, 93 having relative values of, e.g., ½ $R_{NULL}$, ¼ $R_{NULL}$ and ⅛ $R_{NULL}$, respectively. The three resistances 91, 92 93 are selectively switchable into and out of the circuit by parallel connected switches 94, 95 and 96. In other words, the switch-selectable resistive elements have lengths that are in the binary ratios 1:½:¼ . . . ½$^n$, where n is equal to the number of resistive elements minus one. In the example of FIG. 9, one of the resistive elements 90 is permanently in the circuit and the remainder of the resistive elements 91–93 are switch selectable and have length ratios in binary progression.

While the circuits shown in FIG. 8 and FIG. 9 may be manufacturable using field effect transistor switches, there can be problems with the capacitance and resistance of the switches, as well as limitations on the dynamic range of signal voltage swing through the filter imposed by the switch transistor characteristics.

The preferred implementation of a tunable notch filter in accordance with the present invention, such as shown in FIGS. 11 and 13, largely eliminates these problems and gives a notch filter that can operate with a raft-to-rail signal swing.

It will be appreciated that once a notch filter can be formed on a desired frequency, low-pass filters can be constructed by the cascade connection of such devices to position notches in the stop band so that all frequencies above a certain range are suppressed to a desired extent. Such filters may not have the same sharpness of cutoff as, for example, LC filters, but the present invention does allow practical and useful filters to be made in the frequency range 0.3 to 300 MHz, and such a filter has been successfully fabricated that passes frequencies up to about 3 MHz with little attenuation but has high attenuation at 12 MHz and above by the positioning of notches at 12.5 MHz, 35 MHz, 52 MHz and 300 MHz. Because tolerances on the higher frequency notches further away from the passband have little effect on the passband, it was determined that in this instance they did not need to be tunable, and that only the filter having its notch frequency nearest the passband had to be tunable to remove the effect of process spreads.

FIG. 10 shows how an adjustable notch filter can be used to obtain a bandpass amplifier response suitable for frequency-selective, intermediate frequency amplification in radio systems of appropriate bandwidth. A tunable notch device 102 according to the invention is connected as the feedback path around an amplifier 101 such that the gain is suppressed outside the notch frequency when the filter 102 allows a strong, negative feedback signal through, while the gain is high around the notch frequency when the negative feedback effect is reduced. A cascade of such tunable selective amplifiers can be used to form an integrated circuit intermediate frequency strip for small, portable radio receivers. The "tuning bits" shown in FIG. 10 refer to control signals which operate switches 115–119 and 130–132 of FIG. 11 and 135–138 Of FIG. 13.

A preferred arrangement for an adjustable notch filter that does not suffer loss of dynamic range due to the transistor switches is described below.

Adjustment of the notch frequency is provided by means of a stepwise adjustable line length using an advantageous, inventive configuration. This is used with a matching stepwise adjustable resistor to form the adjustable notch device.

A preferred implementation of the adjustable RC line is shown in FIG. 11. A main, permanently in-circuit line section 110 is cascade connected with switchable sections 111,112, 113,114 on either side. Two switchable sections 111, 112 on the left hand side as shown in FIG. 11 have linelengths that are a first fraction dL of the main line length L. The two switchable sections 113, 114 on the fight hand side have fractional lengths 3dL. Thus, various effective line lengths can be achieved by switching by corresponding switches 115, 116, 117, 118, 119, 130, 131, 132 the switchable sections in or out of circuit in the following combinations:

| 111 | 112 | 113 | 114 | Effective line length |
| --- | --- | --- | --- | --- |
| out | out | out | out | L |
| out | in | out | out | L + dL |
| in | in | out | out | L + 2dL |
| out | out | in | out | L + 3dL |
| out | in | in | out | L + 4dL |
| in | in | in | out | L + 5dL |
| out | out | in | in | L + 6dL |
| out | in | in | in | L + 7dL |
| in | in | in | in | L + 8dL |

An important feature achieved by the above arrangement is that the line sections switched into circuit are always contiguous, i.e., no combination of lines such as "in out in" is used. This enables simplification of the switching so that the capacitor plates only of the lines need to be switched. In other words, the switching is thereby simplified as it is only necessary to switch the capacitor plate terminals of the line sections, and not the series resistive part. To switch a line section dL or 3dL to add to the main line length, its capacitor plate is connected to the capacitor plate of the main line (e.g., by switch 115). To prevent the line section adding to the main line length, its capacitor plate is either left unconnected or connected to ground (e.g., by switch 119). The switched out sections therefore appear as separate, short RC lines or series resistors that are in cascade with the device and not additive to the effective main line length L. Thus, when the main line terminal is connected to ground via the nulling resistor of FIG. 13, for instance, the frequency to the null in the frequency response so created is not affected by the switched-out sections.

To provide a matching, stepwise-adjustable nulling resistor, the arrangement of FIG. 12 could in principle be used. This has a main resistor $R_{NULL}$ 123 Of nominal value 0.056 of the resistance of the main RC line total resistance. Two switchable sections (126, 127) of fraction dL/L times the main hulling resistor $R_{NULL}$ and two switchable sections (124, 125) of value 3dL/L are provided, enabling the same control signals that select the line sections to be used to select corresponding switchable pasts of the nulling resistor of FIG. 12.

A disadvantage of the arrangement of FIG. 12 is that the resistance of the switch transistors that can be fabricated on a silicon chip is appreciable compared to the switched resistance. Therefore, the improved arrangement of FIG. 13 is disclosed.

In FIG. 13, adjustment of the total effective resistance R is accomplished by switched shunt resistors of high value instead of switched series resistors of low value. The main resistor value R in FIG. 12 is now shown in FIG. 13 divided into a fraction aR and a fraction (a–1)R. In parallel with the first fraction aR are connected two resistors R1 and R2 switchable into and out of the circuit by two transistors 135, 136. Switching in R1 will reduce the effective value aR to aR–dR where dR is equal to $(aR)^2/(aR+R1)$, while switching in both R1 and R2 will reduce the effective value aR to aR–2dR. Likewise, the two additional resistors R3 and R4 connected in parallel to (1–a)R and switchable into and out of the circuit by two additional transistors 137, 138 allow the resistance (a–1)R to be reduced to (a–1)R–3dR or (a–1)R–6dR. Thus, all values of total resistance from R to R–8dR in steps of–dR can be achieved.

Since the adjustment of R is in the downward direction, the value of R must initially be set to 8dR ohms higher than in FIG. 13, and the switching transistors 135–138 must be operated by inverse control signals to those of the switches 115 to 118 of FIG. 11. The value of the fraction "a" may be chosen so that smallest of the four switchable resistors R1, R2, R3 and R4 is as great as possible in order to minimize the influence of series switch resistance. If "a" is too small, then R1 and R2 will be unnecessarily small while R3 and R4 are large, and vice versa if "a" is too large. Therefore, an optimum exists that can be found by calculation.

The construction of the notch filters and adjustable notch filters and their applications has been described here under the assumption that integration on a silicon integrated circuit is the aim, but one skilled in the art can readily adapt the invention to other forms of fabrication or applications, such adaptations nevertheless being considered to be within the scope of the invention as set forth in the claims. The above discussion of the exemplary embodiments is for purposes of explanation and not limitation. The scope of the invention should be determined by reference to the appended claims.

I claim:

1. An integrated circuit low-pass filter, comprising:

a number of filter sections each having two input terminals and two output terminals and a common terminal, each filter section comprising:

a first resistor connected in series between a first input terminal and a first output terminal of said filter section and a substantially identical second resistor connected in series between a second input terminal and a second output terminal of said filter section, each of said first and said second resistors being formed by depositing a pattern of resistive material over respective conducting plates with an intervening dielectric layer to provide distributed capacitance between said resistive pattern and said conductive plate;

a resistive means connected between each of said conducting plates a resistor connected between the output terminals of at least one of said filter sections, said filter sections being integrated and cascade-connected such that the output terminals of one section are connected to the input terminals of the next.

2. A low-pass filter according to claim 1 wherein at least one of said resistive patterns is tapered.

3. A device according to claim 2 wherein said taper is exponential.

4. A device according to claim 1 wherein a product of a value of said series resistor with a total of said distributed capacitance of at least one of said sections being adjusted to a desired value in order to determine a notch frequency after formation of said low pass filter.

5. A stepwise-adjustable notch frequency filter comprising:

at least one input terminal and at least one output terminal and a ground terminal;

a number of resistive elements constructed as thin films deposited over a corresponding number of conducting plates with an intervening dielectric layer, said resistive elements being connected in series between said at least one input and said at least one output terminal of said filter;

a number of switches arranged to selectively bypass certain of said resistive elements;

a corresponding number of switches arranged to be able to selectively connect together certain of said conducting plates associated with unbypassed resistive elements and to a common terminal which is connected through a resistance to said ground terminal; and means to change the value of said resistance depending on which of said resistive elements are switch-bypassed.

6. A device according to claim 5 wherein the lengths of said switch-selectable resistive elements are in the binary ratios 1:½: ¼ ½ⁿ, where n is equal to the number of resistive elements minus one.

7. A device according to claim 5 wherein one of said resistive elements is permanently in circuit and the remainder of said resistive elements are switch selectable and have length ratios in a binary progression.

8. A stepwise-adjustable notch frequency filter comprising:

at least one input terminal and at least one output terminal and a common terminal;

a first number of resistive elements constructed as thin films deposited over a corresponding number of conducting plates with an intervening dielectric layer, said resistive elements being connected in series between an input and an output terminal of said filter;

a second number of switches arranged to selectively connect certain of said conducting plates together to a resistance connected to said common terminal; and means to change the value of said resistance depending on which of said conducting plates are switch-connected to said resistance.

9. A device according to claim 8 wherein said switches are operated to connect selected conducting plates alternatively to said common terminal or through said resistance to said common terminal.

10. A device according to claim 9 wherein said switches are operated only to select conducting plates associated with sequentially contiguous resistive elements to be connected together.

11. A device according to claim 8 wherein said switches are operated independently to select each conducting plate to be connected either to said common terminal through a separate resistance for each plate or to be connected to a common resistance connected to said common terminal.

12. A device according to claim 11 wherein said switches are operated only to select conducting plates associated with sequentially contiguous resistive elements to be connected together.

13. A device according to claim 8 wherein said switches are operated only to select conducting plates associated with sequentially contiguous resistive elements to be connected together.

14. A device according to claim 13 wherein one of said conductor plates is permanently connected to permanently connected to said common terminal and the remainder of said conducting plates can be selectively switch-connected to said common terminal.

15. A device according to claim 14 wherein said remainder of conducting plates being switchable are disposed on each side of said permanently connected plate as dispersed on a semiconductor substrate.

16. A device according to claim 15 wherein said switchable plates disposed on one side of said permanently connected line have associated resistive elements of length one unit increment and the switchable plates disposed on the other side have associated resistive element lengths equal to N+1 unit increments where N is the number of switchable plates disposed on said first side.

* * * * *